US006988936B2

(12) United States Patent  (10) Patent No.: US 6,988,936 B2
Filipozzi et al.  (45) Date of Patent: Jan. 24, 2006

(54) SURFACE PREPARATION FOR RECEIVING PROCESSING TREATMENTS

(75) Inventors: Laurent Filipozzi, Voreppe (FR); Frederic Metral, Saint-Quentin sur Isere (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/621,122

(22) Filed: Jul. 15, 2003

(65) Prior Publication Data

US 2004/0058626 A1     Mar. 25, 2004

Related U.S. Application Data

(60) Provisional application No. 60/446,985, filed on Feb. 12, 2003.

(30) Foreign Application Priority Data

Jul. 23, 2002   (FR)   .................................. 02 09336

(51) Int. Cl.
    *B24B 1/00*   (2006.01)
(52) U.S. Cl. ............................. 451/41; 451/54; 451/56; 451/60
(58) Field of Classification Search .................. 451/41, 451/54, 57, 59, 60, 63, 285–290
    See application file for complete search history.

(56) References Cited

U.S. PATENT DOCUMENTS

| | | | | | |
|---|---|---|---|---|---|
| 5,571,373 | A | * | 11/1996 | Krishna et al. ............. | 438/693 |
| 5,578,529 | A | * | 11/1996 | Mullins ....................... | 438/692 |
| 5,702,563 | A | * | 12/1997 | Salugsugan et al. ........ | 438/692 |
| 5,755,614 | A | * | 5/1998 | Adams et al. ................ | 451/60 |
| 5,958,298 | A | * | 9/1999 | Nagoshi et al. ............. | 252/392 |
| 5,961,377 | A | * | 10/1999 | Jeong .......................... | 451/56 |
| 5,996,594 | A | | 12/1999 | Roy et al. .................... | 134/1.3 |
| 6,149,508 | A | * | 11/2000 | Vanell et al. ................. | 451/72 |
| 6,213,853 | B1 | * | 4/2001 | Gonzalez-Martin et al. | 451/287 |
| 6,336,945 | B1 | * | 1/2002 | Yamamoto et al. .......... | 51/309 |
| 6,638,145 | B2 | * | 10/2003 | Hall et al. .................... | 451/41 |
| 6,716,089 | B2 | * | 4/2004 | Sharples et al. ............. | 451/56 |

OTHER PUBLICATIONS

Exploring Material Engineering-Semiconductor Materials http://www-engr.sjsu.edu/WofMatE/Semiconductors.htm.*
Michael L. Free, XP-002266271, "Using Surfactants in iron-based CMP slurries to minimize residual particles", Surface Chemistries, Micromagazine (1998).

* cited by examiner

*Primary Examiner*—M. Rachuba
(74) *Attorney, Agent, or Firm*—Winston & Strawn LLP

(57) ABSTRACT

A solution for rinsing a surface that has been planarized using a chemical-mechanical planarization ("CMP") technique. The solution may be a surfactant solution introduced following the use of a polishing solution in the CMP technique. The surfactant solution acts to clear undesirable particles from the planarized surface and also can terminate "latent" effects from the polishing solution. A cleaning solution is generally injected after the rinsing solution for additional cleaning effects. A plate covered with a textured material such a fabric is usually applied to the surface during the polishing, rinsing, or cleaning steps.

20 Claims, 5 Drawing Sheets

SURFACE PREPARATION FOR RECEIVING PROCESSING TREATMENTS

CROSS-REFERENCE TO RELATED PATENT APPLICATION

This application claims the benefit of U.S. Provisional Application No. 60/446,985, filed Feb. 12, 2003, which application is hereby incorporated herein in its entirety by reference thereto.

BACKGROUND

The present invention relates generally to preparing a wafer for processing treatments, and more specifically, relates to configuring a wafer surface to receive active integrated circuit components via semiconductor processing treatments.

Typically, planarization of a wafer surface is performed to suitably prepare the wafer surface for treatment in which the wafer surface is used to guild integrated circuit components (e.g., a transistor). In some known techniques, planarization is conducted through chemical and mechanical action. In chemical-mechanical planarization ("CMP") techniques, the surface of a wafer is polished using a polishing solution and a polishing plate, which is typically shaped in the form of disc. A chemical agent in the polishing solution may be capable of etching the wafer surface. Grit particles that are present in the polishing solution can be capable of eroding the surface through mechanical action. Controlled pressure using the polishing plate can also be applied to the wafer surface.

Residues that result from such CMP processes should be effectively removed because the residues can cause damage to integrated circuits, which will be subsequently formed using the wafer surface. Effective removal can also be beneficial in protecting the surface from further erosion that may exist because of the potential presence of grit particles, chemicals agent, or residues. Residues that may contribute to the continued erosion of a surface under preparation to be configured to receive active components, may include solid residues resulting from the action of the grit particles and may include metallic contaminations that possibly exist on the wafer surface. Further erosion of the surface may be undesirable because precise control over the thickness of the planarized object is sometimes required.

Residue resulting from the polishing action is dealt with in some known CMP techniques by introducing a rinsing solution in association with rotating and applying a polishing plate or another plate to the wafer surface. A plate to be used for polishing is typically selected to be "harder" (stiffer) than a plate that is to be used for rinsing.

In such CMP techniques, rinsing, which is in general conducted with a solution comprising deionized water ("DIW"), is performed in between a polishing and a cleaning step. Such techniques can often reduce the rate of production of polished wafers because the duration used for rinsing needs to be long enough to allow the polishing residues to be properly removed. This aspect is often detrimental in the industrial context.

It is known that an additive of the $NH_4OH/H_2O_2$ ("SC1") or $Hl/H_2O_2$ ("SC2") type may be mixed with DIW to possibly increase the rate of removal of the polishing residues. One drawback of the use of such additives is that their use tends to continue the polishing action. The additive itself can chemically etch the surface of the wafer and, therefore, reduce the thickness of the wafer beyond that which was intended (e.g., by a few additional nanometers). Such further reduction may not be a problem depending on the original thickness of the wafer or depending on the level of tolerance that is available with respect to the specific thickness sought to be achieved.

Other drawbacks may additionally exist in the context of silicon-on-insulator type structures in which a thin layer of a substantially metal-free material containing silicon is subject to such CMP processes. Such structure types may include structures having a strained top layer of a host semiconductor material. Since the top layer in such structures is already thin even before polishing, the available range of tolerance the thickness of the layer can be decreased is relatively limited. Therefore, precise control over the extent of the polishing action is desired. The use of an additive (SC1 or SC2 type) while rinsing with DIW cannot be envisioned to provide the desired precision (e.g., precision in the order of plus or minus 5 nanometers).

In the context of CMP of metallic surfaces, an article by M. L. Free entitled "Using surfactants in iron-based CMP slurries to minimize residue particles" was published in the May 1998 issue of Micromagazine in which techniques for polishing a tungsten wafer with a polishing solution containing surfactants was described. Surfactant agents are typically known for example to be detergents or soaps. The Free articles is hereby incorporated herein in its entirety.

In the context of CMP processes of metal surfaces, the importance of the mechanical action of grit particles is approximately comparable to the chemical action of the etchant. This may be because large-sized grit particles (e.g., around 1 micron) that are used in the CMP process of metal surfaces such as, a tungsten surface, may not be underestimated when compared with the erosion caused by the chemical etchants. In this context, however, the grit particles may also cause damage to the surface being polished (e.g., scratches or holes) because of their considerable size. The use of surfactants in the polishing solution as shown in the M. L. Free publication can soften the abrasive action of the grit particle.

This technique, the use of a surfactant in the polishing solution, appears to have certain drawbacks when applied in the context of a wafer surface that is substantially metal free (e.g., a silicon based). In the context of the CMP of "non-metallic" wafers, the grit particles are typically smaller than the grit particles used in the CMP of metallic surfaces. As a result, the chemical action of the chemical agent in the polishing solution is typically dominant over the mechanical action of the grit particles. Since, the effect of the grit particles is less dominant in the "non-metallic" wafer context, the use of a surfactant in the polishing solution to curb the aggressiveness of the grit particles is of less concern and may disadvantageously increase production costs with little realized benefit to the end product.

Another drawback, is that the use of the surfactant will reduce productivity because it will slow the effect of the chemical agent in the polishing solution. For example, a chemical agent having a basic pH is typically used in CMP processes in planarizing silicon-based surfaces. Adding a surfactant to the CMP polishing solution for such surfaces will reduce or may even counteract the action of chemical agent in the solution because the surfactant typically has an acidic pH. This may substantially increase the wafer polishing time (e.g., increase by a factor of ten) and reduce the productivity of the fabrication line.

Therefore, improved CMP processing technologies are desired.

SUMMARY OF THE INVENTION

The invention relates to a method for preparing a surface of a semiconductor wafer which comprises polishing the wafer surface with a polishing solution that includes dispersed solid particles for mechanically abrading the wafer surface and a chemical agent for chemically attacking the wafer surface, with the polishing conducted to obtain planarization of the wafer surface; and controllably stopping the chemical attack of the wafer surface by progressively introducing a rinsing solution onto the wafer surface to prevent chemical attack of the wafer surface beyond a desired planarization.

Advantageously, the polishing solution has a basic pH and the rinsing solution has an acidic pH, so that the progressive introduction of the rinsing solution changes the pH of the polishing solution to terminate the chemical attack of the chemical agent on the wafer surface.

If desired, the method further includes cleaning from the wafer surface residues resulting from the polishing. The cleaning step preferably includes applying a cleaning solution comprising water to the wafer surface to remove residue(s) therefrom, and the cleaning solution changes the pH of the polishing solution on the surface of the wafer to a neutral pH. The wafer can be dried prior to subsequent processing, and the wafer is made of a silicon material comprising crystalline silicon, silica, glass or quartz.

The rinsing solution preferably includes a surfactant to assist in the removal of residue by the rinsing solution. Generally, the surfactant solution is an aqueous solution containing a polyoxyalkylene alkyl ether surfactant, and the surfactant is present in the surfactant solution at a critical micelle concentration of about 0.1% or less. The rinsing and cleaning solutions each include deionized water for optimum results.

In one embodiment, the stopping of the chemical attack occurs at a rinsing location that is different from that used for the polishing. Also, the polishing and/or the cleaning can include applying a textured material to the wafer surface for polishing or for removing residue(s). The resulting wafer surface can be further treated to form an integrated circuit component that is hosted by material in the wafer layer.

BRIEF DESCRIPTION OF THE DRAWINGS

Further features of the invention, its nature and various advantages will be more apparent from the following detailed description, taken in conjunction with the accompanying drawings in which like reference characters refer to like parts throughout, and in which.

DETAILED DESCRIPTION OF THE PREFERRED EMBODIMENTS

Figure 1:
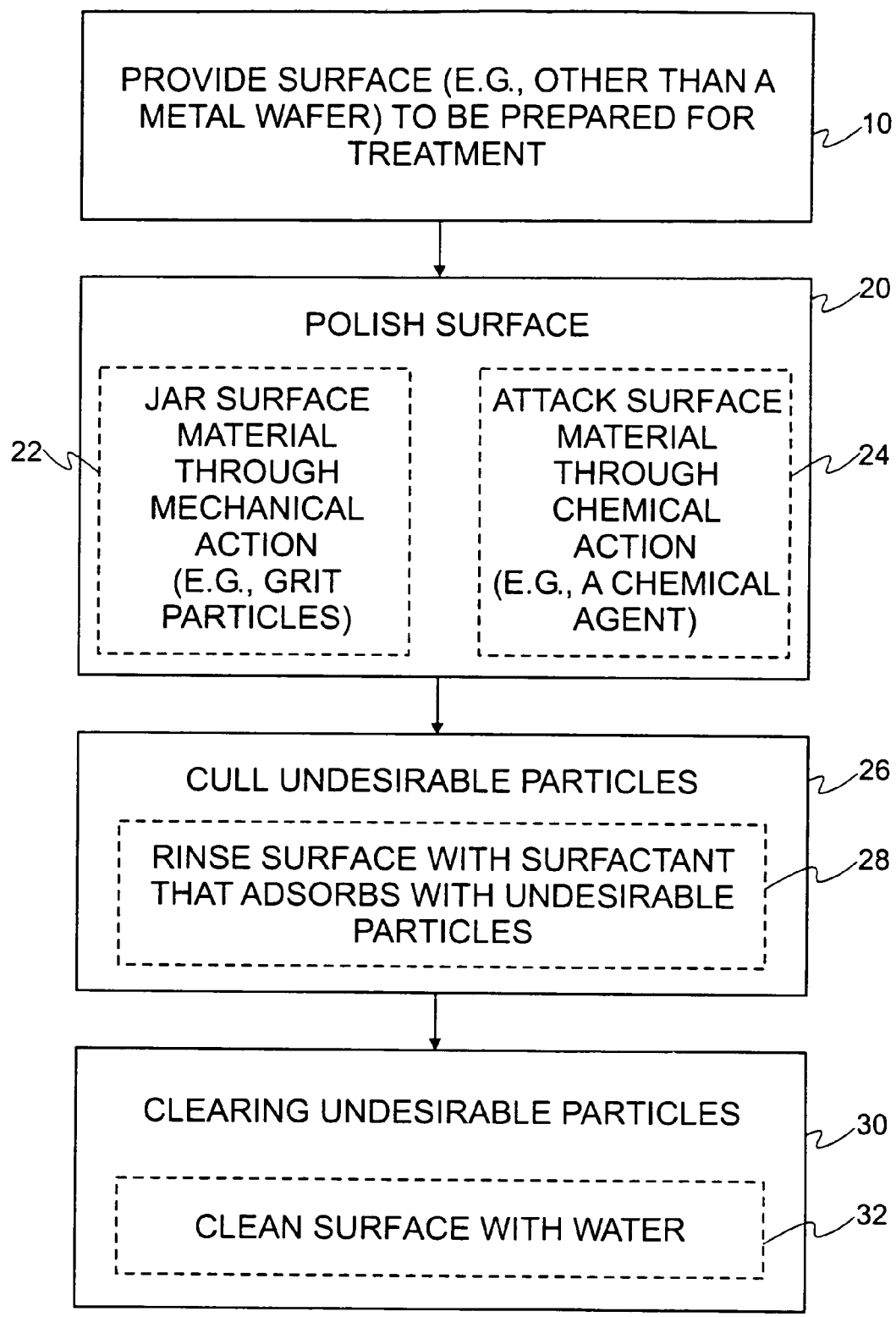
FIG. 1 is a flow chart of illustrative steps involved in preparing a wafer surface for downstream treatment in accordance with one embodiment of the present invention.

In accordance with the principles of the present invention, CMP type processing techniques involving rinsing surfaces with a surfactant solution may be provided. Surfaces such as a "non-metallic" surface of a wafer may be subject to such CMP type processing techniques. Such surfaces may, for example, include a wafer surface of a semiconductor material layer or other layer having material which is capable of hosting an integrated circuit component formed from treatment of the material (e.g., oxidation, doping, etching). A surface may be rinsed with a rinsing solution that acts to clear undesirable particles and to end "latent" polishing action.

Polishing may include using a polishing solution that includes particles for causing mechanical action on a surface being polished and include a chemical agent for chemical attack of the surface. Polishing may be performed to correct surface roughness. A polishing plate, which may be covered with a textured material such as a fabric, may be applied to the surface being polished to increase the effectiveness of the polishing solution and to add a rubbing aspect to the process.

Residue from the polishing may be removed using rinsing and cleaning steps. A rinsing solution containing a surfactant may be used that has hydrophobic and hydrophilic characteristics. The hydrophobic part can bond to residue or undesirable particles in the environment in which the surface is being prepared. The hydrophilic part can act to spread the solution over the surface and to keep the bonded residues or other solid particles suspended in the rinsing solution. The suspension will effectively clear residue from the polished surface and work towards the eventual removal of the residue form the rinsing environment. The base for the surfactant solution may be water (e.g., deionized water).

For materials such as silicon, a surfactant solution that is acidic may be used to end the chemical action of the polishing solution. For silicon based surfaces, a polishing solution having a basic pH is typically used. Injecting a rinsing solution with an acidic pH works towards ending the chemical action of the polishing solution.

Cleaning may be performed following the rinsing using for example, water (deionized water), to remove the surfactant solution and undesirable particles.

A plate that is rotated and applied to the surface may used for polishing, rinsing, or cleaning. The plate may be covered with a textured material. Two or more plates may be used, which may aid in preventing trapped particles from hindering the process. In one embodiment, a carousel type device may be provided that has separate corresponding stations and plates for polishing, rinsing, and cleaning.

Precise control over thickness resulting from in CMP processing of a wafer and effective removal of undesirable particles may be provided by subjecting a wafer surface to rinsing using a rinsing solution that contains surfactants. Specifically, for wafers other than metallic wafers, the surfactant solution may work to terminate or sufficiently slow the chemical and/or mechanical attack that may be underway during a CMP process. In addition, the surfactant solution may aid in cleaning the surface by containing agents that collect/clump onto residue from chemical or mechanical attack of the surface.

Essentially three steps may be used in preparing a wafer surface for future treatment such as for forming an active electronic, optical, or opt-electronic circuit component therein. For example, with reference now to FIG. 1, steps 20, 26, and 30 may be applied to prepare a surface that is provided for treatment. Typically, an entire wafer (e.g. an entire surface face of wafer) is provided to be configured for future treatment. In the semiconductor industry, wafers are produced in volume by manufactures for delivery to application developers that use the prepared wafer to form integrated circuits that are diced from the wafer to form integrated circuit chips.

In step 10, the surface that is provided for preparation is, for example, a surface of a wafer other than a metallic wafer such as the tungsten wafer mentioned above in connection with article by Free. For convenience and brevity, such surfaces or wafers are sometimes referred to herein as nonmetallic wafers or non-metallic surfaces. A nonmetallic surface material may, in some instances, be silicon (e.g., crystalline silicon, silica, glass, quartz, etc.). Such surfaces may include a surface (e.g., a wafer surface) of a layer (e.g., a wafer layer) that is to host one or more integrated circuit components formed from subsequent wafer treatment applied to the surface (e.g., the wafer layer surface). For example, an integrated circuit component may be formed by applying a processing treatment to a planarized and cleaned surface of a layer of semiconductor material so that the material in the layer hosts some or all of the circuit component (e.g., treating silicon with dopants to form portions of a transistor in the silicon).

Although the techniques illustratively discussed herein are sometimes discussed in the context of a wafer, the techniques can be applicable to other structures smaller or larger, or structures that are not wafer-shaped.

At step 20, the surface may be polished to planarize the surface. A CMP type process may, for example, may be implemented at step 20. For example, step 20 may include steps 22 and 24. As step 22, mechanical based planarization may be implemented. For example, at step 22, the surface material may be attacked through mechanical action to jar and/or remove portions of the surface material to reduce the surface roughness. Solid particles, such as grit particles, may be included as part of a polishing solution being used during the polishing step. The solid particles may be dispersed in polishing solution. The mechanical action my result form collisions or rubbing of the solid particles against the surface.

At step 24, chemical based planarization may be implemented. The surface may be subjected to a chemical agent that attacks the surface through chemical action. The chemical action may etch the surface to reduce roughness on the surface to prepare it for future treatment. A chemical agent may be part of a polishing solution, such as those typically used in CMP type processing of nonmetallic surfaces. As in most CMP type processes, the chemical attack of step 24 and the mechanical action of step 22 may be carried at least partly or entirely at the same time. The polishing solution may have pH that favors chemical attack of the current surface material. For example, for silicon, silica, glass, or quartz, the polishing solution may have a basic pH.

At step 26, undesirable particles existing in the polishing environment (e.g., lying on the polished surface) may be culled. Step 26 may be a rinsing step. Undesirable particles such as residue from the polishing action may be selectively removed. For example, step 26, may include 28. At step 28, a solution, a "rinsing solution," may be introduced (e.g., after the introduction of the chemical agent that was used for etching) that contains a suitable concentration of one or more surfactants. The surfactant in solution may for example be a detergent or a soap The surfactant(s), which is likely suspended in the solution, may be capable of adsorbing or affixing to some or all of the different types of undesirable particles (e.g., residue from mechanical action, residue from chemical attack, wafer contaminants, etc.). The adsorption may be intended to result in solution-suspended micelles that contain undesirable particles. This reduces the amount of undesirable particles that are deposited on the surface under preparation and allows the convenient removal of the particles.

At step 30, undesirable particles (e.g., undesirable particles that have been culled) may be cleared from the surface and/or from the environment faced by the surface. Step 30 may include steps 32 in which water (e.g., deionized water) is introduced for cleaning purposes.

Undesirable particles may be cleared during step 32 and/or step 28 by for example, removing (e.g. draining), the surfactant and/or cleaning solution.

In some embodiments, there may be an overlap between steps 20 and 26 and between steps 26 and 30.

During one or more of steps 20, 26, and 30, a plate may be supplied for controllably applying a pressure to the surface while the plate and/or surface are rotated.

Figure 2:
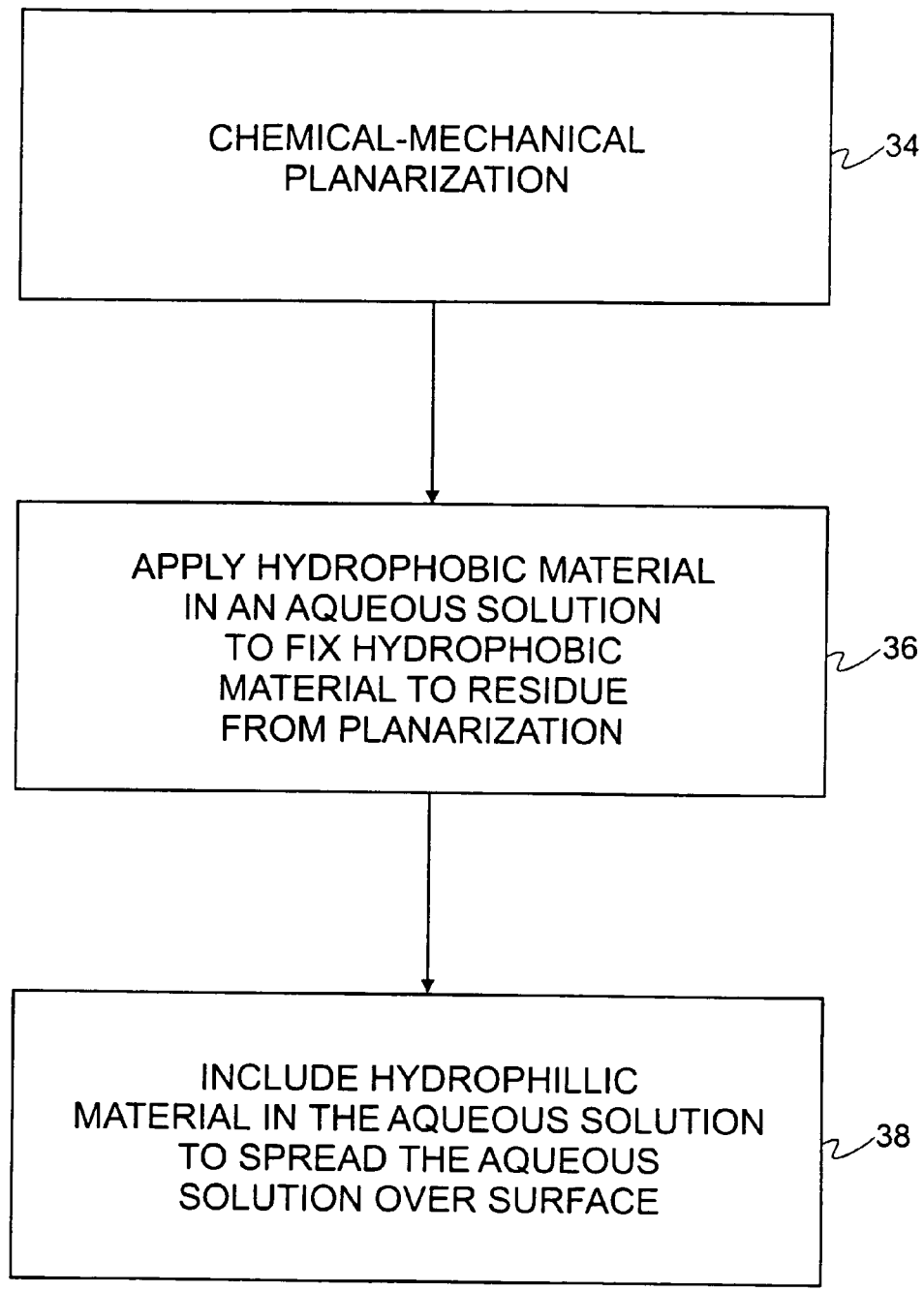
FIG. 2 is a flow chart of illustrative steps involved in rinsing a CMP planar zed wafer surface in accordance with one embodiment of the present invention.

Surfactant in the rinsing solution may have particular characteristics that aid in preparing a surface that is suitably clear of residue and other undesirable particles. For example, with reference now to FIG. 2, a surface such as a wafer surface may be subject to planarization using a CMP type process at step 34.

At step 36, a surfactant solution having hydrophobic parts may be applied to the surface. The surfactant solution may be an aqueous solution. The hydrophobic part may be considered to act physico-chemically.

The hydrophobic part may usually be formed by a long carbon chain of alkyl type. The hydrophobic parts is to have a tendency to flee water and therefore to be fixed to the solid parts formed by the wafer surface and the residual particles on the surface and in suspension.

At step 38, a surfactant solution having hydrophilic parts may be applied to the surface. Hydrophilic particles have a tendency to seek contact with water. Surfactant molecules that are hydrophilic mutually repel each other. The hydrophobic parts may be applied to work to spread solution over the surface. By mutually repelling each other, the hydrophilic part may exert lateral pressure that may reduce interfacial tension between the surface and the surfactant solution. This may provide for good wettability of the surfactant solution on the surface. Through this action, the surfactant may help to remove residues. The hydrophilic part may be considered to act physico-chemically. The surfactant solution is an aqueous solution. Typically, steps 36 and 38 are combined to apply a surfactant solution that has both hydrophobic parts and hydrophilic parts to the surface. The surfactant solution is preferably introduced before the surface dries.

The concentration of the hydrophobic part in the surfactant solution, which bonds with the residues, may be required to be above a certain concentration, which is sometimes called a critical micelle concentration ("CMC"), to create micelles in suspension. Micelles in suspension may generally refer to a state in which aggregates of residual particles to which the hydrophobic parts are attached are put in suspension through the action of the hydrophilic parts. This allows the surfactant solution to disperse residual particles (residual particles bonded to the hydrophobic parts) in the surfactant solution to reduce their deposition on the surface and allow them to be removed. The dispersion and suspension of the residues may work to terminate latent mechanical attack of grit particles.

The value of the CMC typically depends at least on the size of the residual particles to be removed. Specifically, the CMC value used for nonmetallic surfaces, such as silicon, silica, quartz, and glass, is lower than what is for metallic surfaces. This is because the size of the residual particles found are generally smaller.

Another beneficial effect may be that the surfactant particles that are adsorbed on the wafer surface reduce attractive forces (Van der Wall type) exerted between the residues and the surface.

Figure 3:
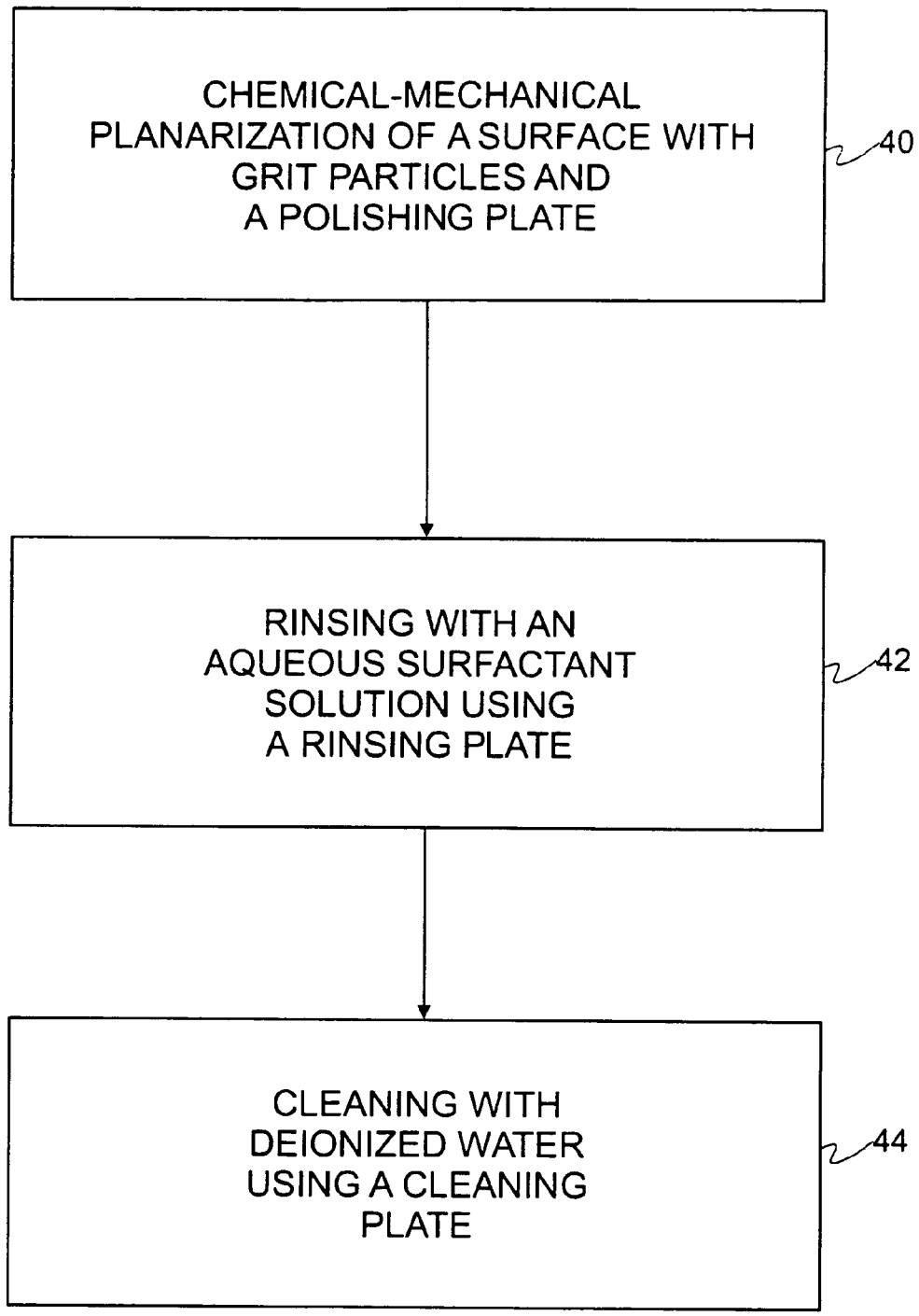
FIG. 3 is a flow chart of illustrative steps involved in preparing a surface for forming integrated Circuit components in accordance with one embodiment of the present invention.

Another important aspect is the chemical action provided by the surfactant solution, which works to terminate the polishing. With reference now to FIG. 3, CMP planarization of a nonmetallic surface using grit particles and a polishing plate may be carried out at step 40. The polishing plate may have a surface facing the surface that is under CMP processing. The surface of the plate and the surface under processing may be positioned in parallel. The polishing solution used in the CMP type process may be injected between the plate and the surface under processing. The plate may be rotated and controlled to apply a pressure on the surface under CMP type processing. Calibration may be used to maintain rubbing forces exerted on the surface at a constant value over the entire surface. The plate may be covered with a textured material such as a fabric (e.g., a pliant fabric).

Since a nonmetallic surface is being planarized, the grit particles may be smaller than that used for metallic wafers. The size of the grit particles in the polishing solution used in the CMP process may preferably be calibrated to be within a desired range. The size of the grit particles needs to be large enough to abrade the surface suitably while avoiding excessive abrading. The grit particles should preferably be small enough not to create obvious surface damage. Such substantial damage may include scratches or "pin holes." Grit particles used for abrading silicon surfaces typically have a size of approximately 0.1 microns, which is much smaller than the 1 micron particle size described in the above-mentioned article for a tungsten surface.

A substantially lower concentration of grit particles is typically used for polishing silicon surfaces than is used for material such as tungsten. For example, the concentration of grit particles for abrading silicon is typically between about 0.01% and 1%. More specifically, the concentration is between about 0.2% and 0.7%, and preferably between about 0.3% and 0.4%. These concentrations are far lower than the concentration typically used for abrasion of metallic materials, which is between about 5% and 25%.

The material of the grit particles should preferably have certain characteristics, such as, hardness when compared to the surface to be planarized (e.g. a silicon surface), resistance to the chemical agent used in the polishing solution, and the ability not to excessively agglomerate. Silica particles may for example be used as the grit particles, at least in the context of silicon surfaces.

The grit particles may function in the CMP type process to rub against the surface under preparation to tear off thin films of materials from the surface. This abrasion may be facilitated by the polishing plate. The polishing plate presses against the surface and also presses the grit particles against the entire surface. If desired, the mechanical action of the grit particles may be assisted further by injecting a solution in the polishing environment that causes the grit particles to be displaced due to a flux caused by the injection. The chemical agent used in the CMP type processing may also aid (e.g., a supplement) the grit particles because the chemical agent may be selected to create chemical reactions on the surface under preparation. The chemical reactions may possibly weaken or detach surface particles. A chemical agent that has a basic pH may, for example, be used for chemical attack of silicon, silica ($SiO_2$), glass, or quartz. A basic pH favors chemical attack of these materials. The chemical attack weakens the bonds of the surface particles.

The base of the polishing solution containing the grit particles and the chemical agent may preferably be water (e.g., deionized water) having a desired pH.

If desired, a surface agent may be added to the polishing solution that increases the wettability of the polishing solution. As a result, the grit particles and dissolved chemical agent may be distributed to allow for a particularly homogeneous abrasion and chemical attack. Otherwise, the chemical attack may dominate over the abrasion since the grit particles smaller than what is used for metallic wafers. Tests have shown that addition of a surface agent provide rapid results with a very good surface finish.

The extent in the reduction of thickness due to the polishing can be controlled in a number of ways. The thickness may be controlled using parameters that control the polishing action and/or using means to stop the polishing action. Parameters that can control the polishing action include the concentration of grit particles in the polishing solution, the concentration of the active chemical agent in the polishing solution, the amount of pressure exerted on the surface during polishing, the speed of rotation of a polishing plate if used, etc.

Controlling the polishing action can be a direct means for controlling the reduction in thickness. Parameters such as the concentrations of components and the speed of rotation of the plate (if used) are easily adjustable and their effects on the polishing, because of the numerous experiments carried out, are predictable and reproducible with satisfactory tolerances, possibly within a nanometer.

Exercising direct control, such as by stopping the rotation of a polishing plate, may not be sufficient. As along as the agents and particles that produce chemical and mechanical action remain, the chemical and mechanical action may continue. Thus, the effective termination of further polishing action and removal or residual particles resulting from the polishing steps (e.g., particles torn off the surface during polishing, particles resulting from certain wear of a fabric possibly covering a polishing plate, etc.) is desired. Termination and clearing may be conducted by rinsing and cleaning the surface.

For example, at step 42, the surface that was subjected to the CMP type processing may be rinsed with an aqueous surfactant solution using a rinsing plate. In polishing the surface, the effectiveness of the chemical attack can depend on the pH of the solution to which it is exposed. In step 42, an acidic surfactant solution may be introduced following a polishing solution with a basic pH to substantially stop the chemical action of polishing solution. This allows control over the chemical etching. The rate and volume of acidic surfactant injected into the surface environment may be such that the pH level transitions from a basic pH that favors attacking the current surface to an acid pH. Thus, the introduction of the acidic surfactant promotes rapid termination of the chemical action of the polishing solution. The use of the acidic surfactant to stop the chemical etching may also be considered to terminate the polishing entirely because the chemical action dominates over the mechanical action when semiconductor surfaces such as silicon are being polished. An advantage of the use of an acidic surfactant solution is that post processing thickness is more readily guaranteed and reproduced because in addition to the direct means that are available to control polishing, indirect means for terminating the polishing action may be exerted.

The chemical agent in the polishing solution for silicon (e.g., silicon in an SOI structure), silica, glass, and quartz typically has a pH between about 7 and 10, and more particularly between about 8 and 10. The chemical agent may be a nitrogen-containing base such as aqueous ammonia. The surfactant, which may be used in this context, may have a pH between about three and five and more particularly the pH is about equal or close to 4. In this case, the surfactant solution may for example be an aqueous solution containing a polyoxyalkylene ether. The rinsing solution may be injected when the injection of the polishing solution stops and before the surface dries because particles will be difficult to remove when dried. Preferably, the rinsing solution is injected progressively because injection that is too rapid may rapidly reduce the pH value at the surface. This may consequently result in increasing the size of silica particles by agglomeration which may increase the risk of the surface under preparation suffering abrasion damage by the agglomerated particles. In one technique, the duration of the rising step is approximately equal to 50% of the polishing duration. As mentioned above, deionized water may be the solution base of the rinsing solution. In the context of silicon type surfaces, the CMC of the surfactant solution may for example be about 0.1% or less. An example surfactant is NCW-1001 from Wako Chemical GmbH, which is a non-ionic surfactant of polyoxyalkylene ether composition, having a pH of approximately 3.7 and a CMC of around 0.01% at room temperature.

As mentioned above, a rinsing plate may be used in rinsing the surface. The function and operation of the rinsing plate may, for example, be the same as the polishing plate (mentioned above). The same plate may even be used for rinsing and polishing. Preferably, different plates are used. One advantage of using separate plates for polishing and rinsing is that it works against the possibility that residues resulting form the polishing are trapped between the plate and the surface to be rinsed. Trapped residues may further erode the wafer surface when it is mixed with the rinsing solution and carried by the plate during rinsing.

The surfactants may also play an electrostatic role by forcing with their chemical action to disturb electrical bonding of the residual particles resulting from the polishing and the surface of the wafer.

This in particular is the case for silicon surfaces abraded by silica molecules contained in a polishing solution having a basic pH. The basicity of the polishing solution used can cause the grit particles to be electrically attracted to the surface of the wafer. The acidity provided by the (acid) surfactant injected during rinsing will, on the contrary, reduce the attraction between the grit particles and the polished surface, or even repel the grit particles.

The electrical neutrality of a surfactant may prevent from the intrusion of contaminants into the surface material because the neutrality interferes with the undesirable influence of the grit particles and residues on the electrical properties of the semiconductor surface.

However, it is also possible to act more strongly from the electrical standpoint by choosing ionic surfactants that have the opposite polarity to that of the material present on the surface of the wafer. Thus, the ionized molecules may collect together on the surface of the wafer and reverse the electric polarity of the surface so as to repel the residual particles having the same polarity as the surface, which particles would have a tendency to bond to the surface.

Although ionic water may be used, it is deionized water that is typically used as the based for the surfactant solution. Electrical aspects that can be considered to be associated with surfactant solution processing are illustratively addressed in an article entitled "Minimization of Particle Contamination During West Processing of Si Wafer" by M. Itano et al., published in J. Electrochem. Soc., Vol. 142, No. 3, March 1995, where is hereby incorporated by reference herein in its entirety.

At step 44, cleaning with deionized water using a cleaning plate may be performed. The deionized water may be introduced into the polishing environment to flush away the residue, grit particles, chemical agents, surfactant solution, etc. and to further clear the polishing environment, which includes the surface that has been polished. Deionized water is preferably used for the cleaning, but other liquids may also be used if desired. A cleaning plate may be used that is rotated and applied to the surface undergoing cleaning. The cleaning plate may have the same function, structure, or operation as the polishing plate. The contact of the plate with the surface along with rotating the plate can contribute to displacing the liquid present on the surface and removing it more rapidly. The same plate may be used for polishing, rinsing, and cleaning, or sub-combination thereof may be used. Preferably, different plates are used. Cleaning step 44 may bring that surface to a neutral pH.

Techniques illustratively described herein may be particularly useful for preparation of SOI type structures (e.g., SOI structures in which silicon is the top layer formed over silica, quartz, or glass). In such structures, the layer that is to receive active components through semiconductor treatments may be thin compared to the typical thickness of wafers, even before planarization has been carried. Silicon on Quartz structures ("SOQ") may also fall within this category of structures.

In general, wafers that are planarized using the techniques illustratively shown here may for example have a thickness possibly ranging from about a few micrometers to a few millimeters.

In general, a wafer includes what may be considered an active layer, a layer that is to receive electronic, optical, or opto-electronic components, that is a surface layer having a thickness ranging from about a few nanometers to a few micrometers, and more specifically between about one and few tens of nanometers. This can typically be the case in SOI type structures (e.g., a silicon on silica structure where the silicon runs within the upper portion of the SOI wafer). Using the techniques illustratively shown here, precise control may be effected to prevent the thickness of the active layer from being excessively reduced. This allows the top layer of SOI type structures to be subject to CMP type polishing involving simultaneous macroscopic attack (e.g., rubbing force of a polishing plate), microscopic mechanical attack (e.g., grit particles in polishing solution), and chemical attack (e.g., using a chemical agent in the polishing solution) without reducing the thickness of the top layer beyond a level that is useful for receiving active integrated circuit components. The techniques illustratively described herein may be used to improve the clearing of undesirable particles from the SOI type structure and to substantially terminate the erosion of the top surface when desired.

Figure 4:
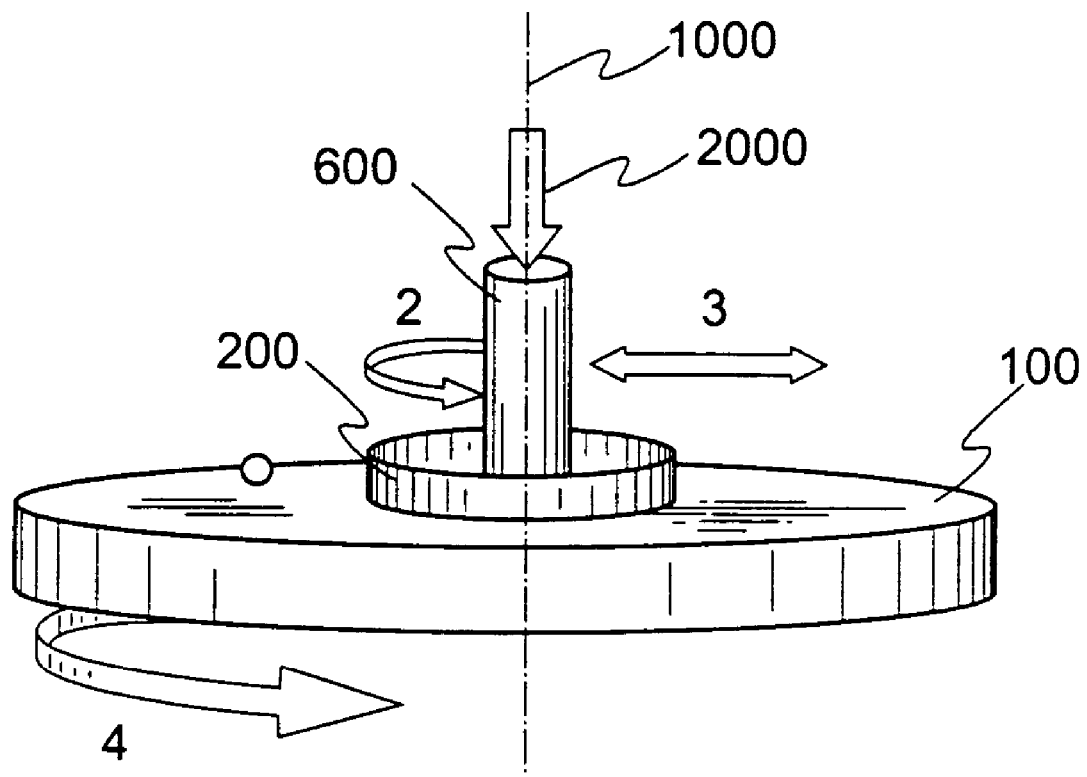
FIG. 4 is a diagram of a wafer surface being prepared for further treatment in accordance with one embodiment of the present invention.
Figure 5:
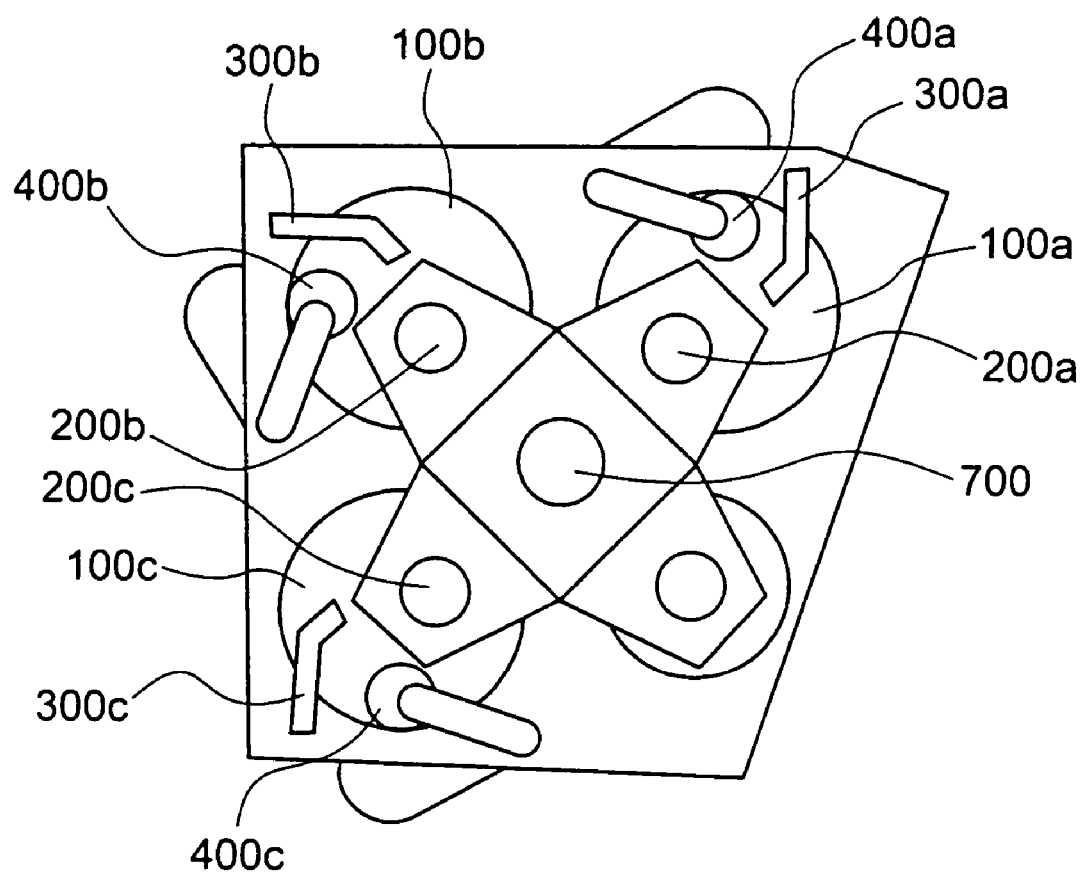
FIG. 5 is a diagram of a wafer preparation device having multiple heads in accordance with one embodiment of the present invention.

Illustrative devices or portions thereof for implementing techniques illustratively presented herein are shown in FIGS. 4 and 5. With reference now to FIG. 4, a polishing device may, for example, include polishing head 200, drive shaft 600, and polishing plate 100.

Polishing head 200 may have an internal cavity suitable for housing a wafer. The shape and dimensions of the internal cavity of polishing head 200 may correspond substantially to the shape and to the dimensions of the wafer to be polished. Drive shaft 600 may be used to rotate polishing head 200. Polishing plate 100 may also be capable of being rotated. Polishing plate 100 may be used to close the cavity of polishing head 200 and to press the wafer contained in the cavity against the surface of the plate. Polishing plate 100 may rotate about axis 1000, which may be stationary. Axis 1000 is for example parallel to shaft 600. The surfaces of polishing plate and the wafer may be positioned in parallel to each other. If desired, polishing head 200 and/or polishing plate 100 may be shifted horizontally while maintaining their facing surfaces substantially in parallel.

Force 2000 applied along shaft 600 to polishing head 200 may if desired bring the wafer into contact with the transverse wall of the cavity of head 200 and with the upper surface of plate 100. For example, force 2000 may be a force that is approximately equal to $0.14$ kg/cm$^2$ (2 psi). If desired, force may also be applied to plate 100 to place head 200, plate 100, and the wafer in contact. Respective rotational movements 2 and 4 of head 200 and plate 100 relative to the wafer can cause rubbing on at least one face of the wafer and thus cause polishing. Speeds of rotation associated with movements 2 and 4 are typically between about 30 and 60 rpm. If desired, only one of polishing plate 100 and polishing head 200 may be rotated. If desired, rotation of plate 100 and head 200 may be conducted in opposite directions. If desired, head 200 may include an internal polishing plate which is rotated to operate on the surface of the wafer facing away from plate 100.

In one embodiment, polishing head 200 containing a wafer is moved over the upper surface of polishing plate 100 in a defined path so as to make the polishing as homogeneous as possible. For example, a helical movement or translational to-and-fro movement 3 along a defined axis may be performed. As mentioned above, polishing plate 100 may be covered with a textured material such as a fabric. Polishing, rinsing, and/or cleaning solutions may be injected across the plate 100, wetting the plate surface (e.g., the fabric cover), which thus optimally distributes the solution over the entire surface of the wafer.

In one embodiment, the same plate, plate 100 is used for polishing, rinsing, and cleaning functions. As mentioned above, several plates may also be used if desired.

For example, in another embodiment, the polishing function is fulfilled by a polishing plate and the rinsing and cleaning functions are fulfilled by a rinsing/cleaning plate. This approach, decouples the polishing from the rinsing/cleaning and improves the quality of the rinsing by using a "virgin" plate for the rinsing.

Further step in improving the effectiveness of clearing undesirable particles from the polished surface may be to further decouple the process by using separate plates for the rinsing and cleaning. This would allow a "virgin" plate to be used for each of polishing, rinsing, and cleaning.

The device illustratively shown in FIG. 5 implements separate plates for the polishing, rinsing, and cleaning. The device may implement a CMP method in which surface roughness correction of a wafer is conducted, and followed by a rinsing step and cleaning step. The device may include polishing plate 100*a*, rinsing plate 100*b*, cleaning plate 100*c*, three solution injectors 300*a*, 300*b*, 300*c* associated with the three plates, polishing heads 200*a*, 200*b*, 200*c*, brushing devices 400*a*, 40*b*, 400*c*, and shaft 700.

Polishing heads 200*a*, 200*b*, 200*c* may be joined together via arms extending out from shaft 700. Polishing heads 200*a*, 200*b*, 200*c* may be positioned to be equidistant from rotation shaft 700 and move with respect to shaft 700 using a carousel type principle.

Preferably, plates 100*a*, 100*b*, 100*c* are in contact with brushing devices 400*a*, 400*b*, 400*c*, respectively, so as to be able to periodically remove surface residues from the plates. If desired, additional plates or fewer plates may be implemented.

In one way of using this device, plate 100*a* and head 200*a* perform a polishing action identical to that indicated in FIG. 5. In addition to this mechanical polishing action, a polishing solution supplied by the injector 100*a* performs chemical etching by means of an etchant and mechanical etching by means of grit particles.

Polishing head 100*a* may take the wafer to rinsing plate 100*b* and finally to cleaning plate 100*c* by a rotational movement. The movement is performed to carry out the respective operations of rinsing and cleaning. Injectors 300*b* and 300*c* may be used to inject rinsing and cleaning solutions during corresponding steps.

One or more plates may be used for each of polishing, rinsing, or cleaning.

The three plate apparatus may be preferable in that the three successive plates and management of the rates of injection of the rinsing cleaning solution, helps to achieve a progressive change from basic (polishing) pH to neutral pH, from neutral pH to acid (rinsing) pH and finally to a neutral (cleaning) pH.

Application of these techniques to SOI wafers has resulted in planarizing, rinsing, and cleaning a wafer surface in 60 seconds having a wafer surface that is about 50% better in terms of number of particles per wafer over conventional techniques.

Although techniques discussed herein are sometimes specifically discussed in the context of planarizing and clearing undesirable particles from a silicon based surface (e.g., the top surface of silicon layer), one skilled in the art will understand that these techniques can be applicable to other material, more specifically to semiconductor material such as GaAs, SiC, Indium Phosphide, SiGe, Ge, etc.

Features illustratively described herein are discussed at times herein in the context of nonmetallic materials or surfaces of nonmetallic layers, because within known conventional processing treatment technology, metals are not capable of having or are not typically configurable to have an integrated circuit component formed therein.

It is to be understood that the invention is not to be limited to the exact configuration as illustrated and described herein. Accordingly, all expedient modifications readily attainable by one of ordinary skill in the art from the disclosure set forth herein, or by routine experimentation there from, are deemed to be within the spirit and scope of the invention as defined by the appended claims.

What is claimed is:

1. A method for preparing a surface of a semiconductor wafer which comprises:

polishing the wafer surface with a polishing solution that has a basic pH and includes dispersed solid particles for mechanically abrading the wafer surface and a chemical agent for chemically attacking the wafer surface, with the polishing conducted to obtain a desired planarization of the wafer surface; and controllably stopping the chemical attack of the wafer surface by progressively introducing a rinsing solution that contains an acidic component into the polishing solution and onto the wafer surface so that the progressive introduction of the rinsing solution reduces the pH of the polishing solution to prevent chemical attack of the wafer surface when polishing stops so as to obtain the desired planarization of the wafer surface.

2. The method of claim 1 wherein the stopping of the chemical attack occurs in the same polishing device that is used for the polishing and the pH of the polishing solution on the surface of the wafer when polishing stops is a neutral pH.

3. The method of claim 1 further comprising cleaning from the wafer surface residues resulting from the polishing.

4. The method of claim 3 wherein the cleaning step includes applying a cleaning solution comprising water to the wafer surface to remove residue(s) therefrom.

5. The method of claim 4 which further comprises drying the wafer prior to subsequent processing.

6. The method of claim 1 wherein the wafer is made of a silicon material comprising crystalline silicon, silica, glass or quartz.

7. The method of claim 1 wherein the polishing solution has a pH of between about seven and ten and the acidic component in the rinsing solution has a pH between about three and five so that the pH of the polishing solution on the surface of the wafer after stopping polishing is a neutral pH.

8. The method of claim 7 wherein the polishing solution has a pH of between about eight and ten and the acidic component in the rinsing solution has a pH that is equal or close to about four so that the pH of the polishing solution on the surface of the wafer after stopping polishing is a neutral pH.

9. The method of claim 7 wherein the chemical agent comprises a nitrogen-containing base.

10. The method of claim 1 wherein the acidic component in the rinsing solution comprises a surfactant to assist in the removal of residue by the rinsing solution.

11. The method of claim 10 wherein the surfactant in the rinsing solution is a polyoxyalkylene alkyl ether surfactant.

12. The method of claim 10 wherein the surfactant is present in the rinsing solution at a critical micelle concentration of about 0.1% or less.

13. The method of claim 4 wherein the rinsing and the cleaning solutions each include deionized water.

14. The method of claim 1 wherein the polishing includes applying a textured material to the wafer surface.

15. The method of claim 3 wherein the cleaning comprises applying a textured material to the wafer surface for removing the residue(s).

16. The method of claim 1 which further comprises treating the wafer surface to form an integrated circuit component that is hosted by material in the wafer layer.

17. The method of claim 3 wherein the surface residues are removed by contacting the surface with a surfactant solution comprising a hydrophobic surfactant, a hydrophilic surfactant or a combination of a hydrophobic surfactant and a hydrophilic surfactant.

18. A method for preparing a surface of a semiconductor wafer which comprises:

polishing the wafer surface with a polishing plate that includes a polishing solution that has a basic pH and includes dispersed solid particles for mechanically abrading the wafer surface and a chemical agent for chemically attacking the wafer surface, with the polishing conducted to obtain a desired planarization of the wafer surface;

controllably stopping the chemical attack of the wafer surface with a separate rinsing plate that progressively introduces a rinsing solution that contains an acidic component onto the wafer surface so that the progressive introduction of the rinsing solution reduces the pH of the polishing solution to prevent chemical attack of the wafer surface beyond the desired planarization of the wafer surface; and cleaning the rinsed wafer with a separate cleaning plate, with the pH of the solution contacting the wafer progressively changing from basic to neutral during polishing, then from neutral to acidic during acidic rinsing, and from acidic to neutral during cleaning.

19. The method of claim 18 wherein the wafer surface includes a thin silicon layer having a thickness of a few tens of nanometers and that layer is successfully polished to within plus or minus 5 nanometers.

20. The method of claim 1 wherein the wafer surface includes a thin silicon layer having a thickness of a few tens of nanometers and that layer is successfully polished to within plus or minus 5 nanometers.

* * * * *